United States Patent [19]

Yamazaki

[11] Patent Number: 5,260,265
[45] Date of Patent: * Nov. 9, 1993

[54] PRODUCTION OF OXIDE SUPERCONDUCTING FILMS BY MULTILAYER DEPOSITION

[75] Inventor: Shunpei Yamazaki, Tokyo, Japan

[73] Assignee: Semiconductor Energy Laboratory Co., Ltd., Kanagawa, Japan

[*] Notice: The portion of the term of this patent subsequent to Mar. 31, 2009 has been disclaimed.

[21] Appl. No.: 818,874

[22] Filed: Jan. 10, 1992

Related U.S. Application Data

[63] Continuation-in-part of Ser. No. 172,231, Mar. 23, 1988, Pat. No. 5,100,863.

[30] Foreign Application Priority Data

Mar. 23, 1987 [JP] Japan ................ 62-069449

[51] Int. Cl.$^5$ .............................................. B05D 5/12
[52] U.S. Cl. ........................................ 505/1; 505/731; 505/732; 505/730; 505/741; 505/742; 427/62; 427/282; 427/419.2; 427/419.3; 427/126.3; 204/192.24
[58] Field of Search ................ 505/1, 731, 732, 730, 505/741, 742; 427/62, 63, 126.3, 419.2, 419.3, 282; 204/192.24

[56] References Cited

U.S. PATENT DOCUMENTS

5,100,863  3/1992  Yamazaki ................ 505/1

OTHER PUBLICATIONS

Hammond et al, "Superconducting thin films of the perovskite superconductors by electron-beam deposition", MRS (Anaheim, Calif.) Apr. 1987 Edited by Gubser et al, pp. 169–171.

Tsaur et al, "Preparation of superconducting $YBa_2Cu_3O_x$ thin films by oxygen annealing of multilayer metal films", Appl. Phys. Lett. 51(11) Sep. 1987 pp. 858–860.

Bao et al, "YBaCuO Superconducting thin films with zero resistance at 84K by multilayer deposition", Appl. Phys. Lett. 51(12) Sep. 1987 pp. 946–947.

*Primary Examiner*—Roy King
*Attorney, Agent, or Firm*—Sixbey, Friedman, Leedom & Ferguson

[57] ABSTRACT

An Improved method of manufacturing superconducting ceramics in the form of a thin film are described. The thin film is first formed of a superimposed structure composed of three films which contain a rare earth metal, an alkalline earth metal and copper respectively. Then the superimposed thin film is fired to convert to a superconducting film.

3 Claims, 2 Drawing Sheets

$Bi_2Sr_3Ca_2Cu_2O_x$

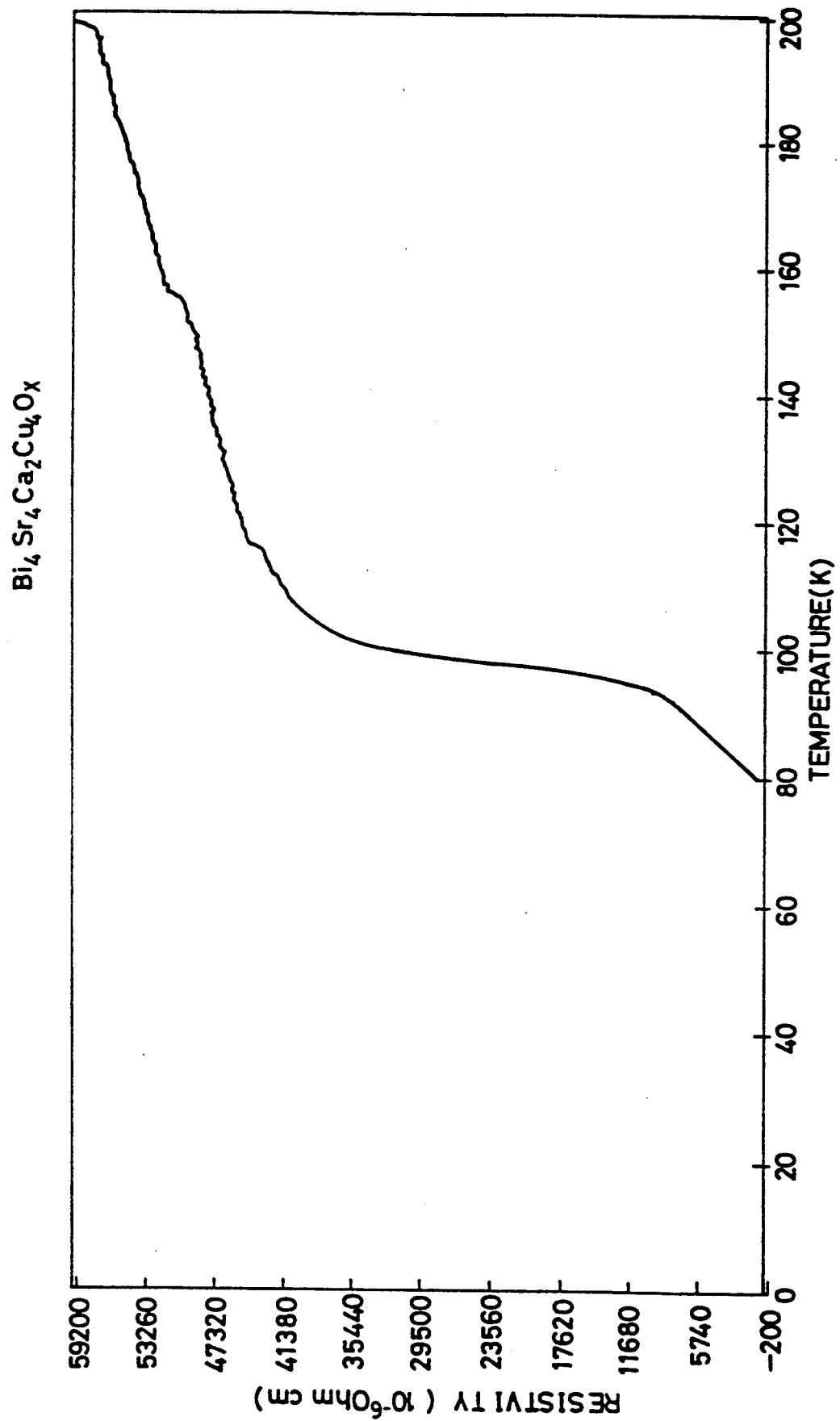

PRODUCTION OF OXIDE SUPERCONDUCTING FILMS BY MULTILAYER DEPOSITION

This is a continuation-in-part of copending application, Ser. No. 07/172,231 filed on Mar. 23, 1988, now U.S. Pat. No. 5,100,863.

BACKGROUND OF THE INVENTION

This invention relates to superconducting ceramics manufacturing method.

The prior art has proposed the use of metal such as mercury and lead, intermetallics such as NbNd, Nb$_3$Ge and Nb$_3$Ga, and ternary materials such as Nb$_3$(Al$_{0.8}$Ge$_{0.2}$) as superconductors. Another type of superconducting material, superconductive barium-lead-bismuth oxides is described in U.S. Pat. No. 3,932,315. However, only three-dimensional electron conduction takes place in such conventional superconducting materials, and the critical transition temperature Tc of such a conventional superconducting material can not therefore exceed 25° K.

In recent years, superconducting ceramics have attracted widespread interest. A new material was first reported by researchers at the Zurich laboratory of IBM Corp. as Ba—La—Cu—O-type high tem superconducting oxides. Also, La—Sr—Cu(II)—O-type superconducting oxides have been proposed. This type of superconducting material appears to form a quasi-molecular crystalline structure whose unit cell is constructed with one layer in which electrons have essentially one dimensional motion.

SUMMARY OF THE INVENTION

It is therefore an object of the invention to provide an improved method of manufacturing superconducting ceramics including the K$_2$NiF$_4$ type structure.

In accrodance with the present invention, the metals or metallic compounds prepared separately for respective metals to conform the composition of superconducting ceramics are formed by vacuum evaporation deposition, sputtering, printing, coating or vapor phase method into thin films which are superimposed one on another into a multi-layered structure. When the metal itself is employed for each metallic constituent, the thickness is chosen about 300-5000 Å, e.g. 500 Å. Then, the multi-layered structure is fired to endow the same with a superconductivity, in which a layered structure associated with four copper atoms is constructed.

More generally speaking, each thin film of the multi-layered structure corresponds not necessarily only to one metallic constituent. For example, when an rare earth element, an alkalline earth element and copper are the metallic constituents of superconducting ceramic, a couple of tablets can be used as targets, e.g. one containing the rare earth element and the alkalline element and the other containing copper, one containing the rare earth element and copper and the other containing the alkalline earth element and copper, and the other possible combinations.

BRIEF DESCRIPTION OF DRAWINGS

FIGS. 1 and 2 are graphical diagrams showing the relationship between the resistivity and the temperature of the superconducting ceramics.

DETAILED DESCRIPTION OF THE PREFERRED EMBODIMENTS

Figure 1:
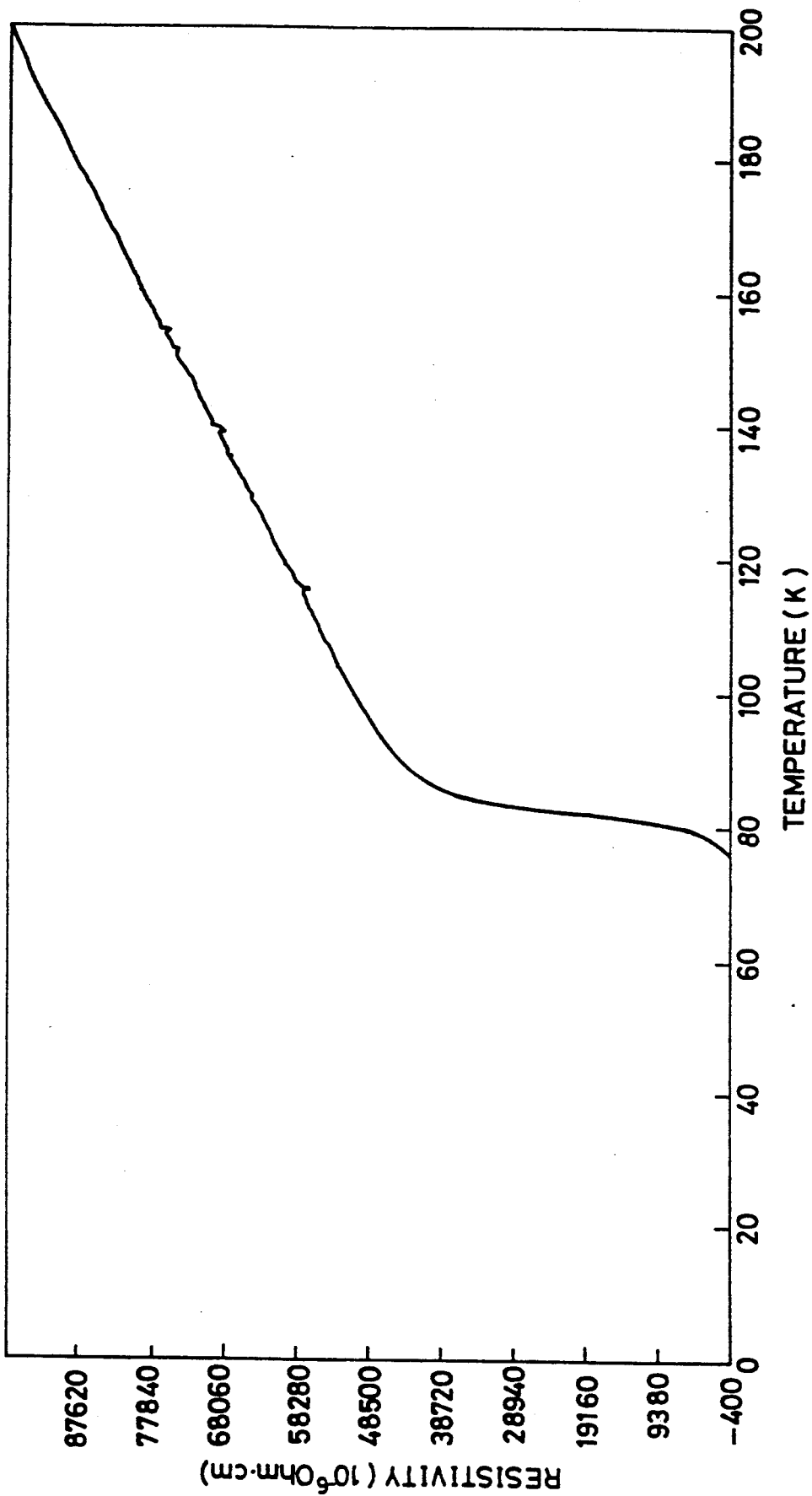

Described hereinafter are a number of examples illustrating the manufacture by a method according to the present invention of superconducting ceramics conforming to the stoichiometric fomula:

$$(A_{1-x}B_x)_yCuO_z$$

wherein x=0.01–0.3; y=1.0–2.2; z=2.0–4.5, and

A stand for one or more elements selected from rare earth elements and B stand for one or more elements selected among from alkali earth metals. One example is YBa$_2$Cu$_3$O$_{6-8}$ 

According to "Chambers Science and Technology Dictionary" distributed by W & A Chambers Ltd., rare earth elements are the lanthanide elements 57 to 71, plus scandium (21) and yttrium (39). Namely, La, Ce, Pr, Nb, Pm, Sm, Eu, Gd, Tb, Dy, Ho, Er, Tm, Yb, Lu, Sc (scandium) and Y (yttrium). Alkali earth metals are elements belonging to Group 2A of the periodic table. Namely, Be, Mg, Ca, Sr, Ba, and Ra.

In accordance with the present invention, "A", "B" and copper are layered with respective thin films as metals (simple substance) or oxides by vapor deposition, sputtering, printing, coating or vapor phase method, and then oxidized by firing to form a superconducting thin film. Alternatively, when formed by sputtering, two tablets including different metallic constituents can be employed as targets.

EXAMPLE 1

Y$_2$O$_3$, BaCO$_3$, and CuO all in the form of fine powder having a purity of 99.95% or higher were prepared to make superconducing ceramics conforming to the above formula with x=0.15; y=1.8; z=2.0–5.0 and with A being Y and B being barium. The experiment was repeated with the value of x changing from 0.01 to 0.3, i.e. 0.05, 0.1, 0.15 and 0.2. These materials were packed into respective capsules and pressed in the form of tablets of 10 mm diameter and 3 mm thickness respectively under a pressure of 3 Kg/cm$^2$, followed by firing. Then, thin films each being 300-5000 Å thick were formed one on another by sputtering with the three tablets switching in turn as a target. The multi-layered structure was fired for 8 hours at 500°-1200° C., for example 700° C., in oxidizing surroundings, for example ambient air. After this firing, the total thickness was measured to be 500 Å − 1 micron, e.g. 2000 Å. Finally, the tablets were reduced by heating for 3–30 hours, e.g., for 20 hours, at 600°-1200° C., e.g., at 800° C. in an oxygen/argon mixture containing a minor of oxygen.

The relationship between the temperature and the resistivity of this material in tablet form was investigated. It was obserbed that the phase transition to superconducting state began as the temperature descended below 38° K. (Tc onset temperature) and the disappearance of resistance was observed at 28° K. (Tco).

EXAMPLE 2

The powder mixture of yttrium metal and ytterbium metal (Y:Yb=1:1) was employed as "A" of the formula, and barium metal as "B". Both were formed on a substrate by vacuum evaporation deposition into thin films respectively. A copper thin film was formed on the two thin films by vapor deposition in the same manner. Other condition was same as that of Example 1.

The relationship between the temperature and the resistivity of this film was investigated. The phase transition to superconductivity was observed when the temperature descended below 39° K. (Tc onset temperature) and the disappearance of resistance was observed at 27° K. (Tco).

This process can be repeated several times on the superconducting film formed by the preceding process. The thickness increses by 0.2-1.0 micron per process. However, in accordance with experimental, Tco was elevated by 5°-20° K. per process.

EXAMPLE 3

Yttrium($Y_2O_3$) was employed as "A" of the formula, and barium ($BaCO_3$) as "B", while copper was introduced as metal. They are all prepared as liquid compound such as alkylenes thereof and diluted with a thinner respectively. A surface was coated with three thin films each being 0.03-0.5 micron, e.g. 0.3 micron by spinner using the respective thinned liquids. Then, the three films were fired in the same way as performed in Example 1. Tc onset and Tco were measured to be 45° K. and 38° K. respectively.

The following formulae are variations of above general formulae of superconducting ceramic materials which are produced according to the present invention.

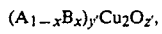

wherein $y'=2.6-4.4$; $z'=4.0-8.0$, for example $y'=3$, $z'=7$ or $y'=2$, $z'=6$.

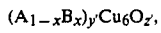

wherein $y'=6$, $z'=14$.

The superconducting ceramic material for use in accordance with the present invention also may be prepared consistent with the stoichiometric formula $(A_{1-x}B_x)_yCu_zO_w$, where A is one or more elements selected from Group Vb of the Periodic Table such as Bi, Sb and As. B is one or more elements selected from one or more alkaline earth elements, and $x=0$ to 1 $y=2.0-4.0$; $z=1.0-4.0$, and $w=4.0$ to 10.0, preferably $x=0.01$ to 0.3 $y=2.5$ to 3.5, $z=1.5$ to 3.5, and $w=6.0$ to 8.0. Examples of this formula are $BiSrCaCu_2O_x$ and $Bi_4Sr_3Ca_3Cu_4O_x$. Tc onset and Tco of samples confirmed consistent with the formula $Bi_4Sr_yCa_3Cu_4O_x$ (y is around 1.5) were measured to be 40°-60° K., which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The data showing high critical temperatures are illustrated in FIGS. 1 and 2. The number x showing the oxygen proportion is 6-10, e.g. around 8.1. In this description, Group Vb is directed to the typical element on a column of the Periodic Table while Group IIa is directed to the transition element on a column of the Periodic Table.

Further, the superconducting ceramic material for use in accordance with the present invention may be prepared consistent with the stoichiometric formula $(A_{1-x}B_x)_yCu_zO_w$, where A is one or more elements selected from Group IIIb of the Periodic Table, B is one or more elements selected from alkali earth elements, and $x=0-1$, $y=2.0-4.0$, $z=1.0-4.0$, and $w=4.0-10.0$. For one example of the above superconducting ceramic material, thallium (Tl) was employed as "A" of the formula, and barium (Ba) and calcium (Ca) as "B". A MgO substrate having (100) plane was used as a substrate. Each of these metallic elements was deposited thereon in multi-layer structure so as to conform to the ratio of Ba:Ca:Cu=2:3:4. The deposition was carried out using such as electron gun or Knudsen cell under a high vacuum condition of about $10^{-8}$ Torr. The multilayer structure was then annealed at 800° to 860° C. for 1 to 40 hours, e.g. at 850° C. for 10 hours, in an atmosphere comprising a $Tl_2O_3$ vapor, oxygen, and argon. After this annealing, the total thickness was measured to be 100 Å to 1 μm, e.g. 500 Å.

The relationship between the temperature and the resistivity of this multi-layer structure was investigated. The phase transition to superconducting state was observed when the temperature descended below 120° K. (To onset temperature) and the disappearance of resistance was observed at 105° K. (Tco).

While several embodiments have been specifically described, it is to be appreciated that the present invention is not limited to the particular examples described and that modifications and variations can be made without departure from the scope of the invention as defined by the appended claims. For example, although the description is not directed to the pattern of the superconducting thin films, the patterning of superconducting ceramic thin films can be performed, e.g. by printing method suitably.

I claim:

1. A method of forming a superconducting ceramic film comprising:
   forming at least one layer on a surface to be coated, said layer consisting of a plurality of superimposed thin films, each of which contains a different metallic constituent of a superconducting ceramic material; and
   firing said layer in an oxidizing gas containing atmosphere and transforming the same to said superconducting ceramic film.

2. The method of claim 1 wherein said thin films are formed by vacuum evaporation deposition, sputtering, printing, or vapor phase method.

3. A method of forming a film of superconducting, metallic oxide ceramic comprising:
   forming a layer on a surface to be coated, said layer including different metallic constituents of a superconducting ceramic material, wherein said layer is initially formed from a plurality of thin films, each of which containing at least one of said metallic constituents, and
   firing said layer in an oxygen containing atmosphere and transforming the same to said film of said superconducting, metallic oxide ceramic.

* * * * *